United States Patent [19]
Frazier

[11] Patent Number: 4,721,983
[45] Date of Patent: Jan. 26, 1988

[54] THREE TERMINAL TUNNELING DEVICE

[75] Inventor: Gary A. Frazier, Garland, Tex.

[73] Assignee: Texas Instruments Incorporated, Dallas, Tex.

[21] Appl. No.: 824,701

[22] Filed: Jan. 31, 1986

[51] Int. Cl.$^4$ .................. H01L 27/12; H01L 45/00; H01L 49/02

[52] U.S. Cl. .................. 357/4; 357/16; 357/23.15; 357/23.2

[58] Field of Search .................. 357/16, 23.15, 23.2, 357/4

[56] References Cited

U.S. PATENT DOCUMENTS 4,641,161  2/1987  Kim et al. .................. 357/23.2

FOREIGN PATENT DOCUMENTS

215077  12/1983  Japan .................. 357/4

Primary Examiner—Martin H. Edlow
Assistant Examiner—David Josephs
Attorney, Agent, or Firm—Carlton H. Hoel; James T. Comfort; Melvin Sharp

[57] ABSTRACT

A three terminal tunneling device analogous to a field effect transistor is disclosed. Preferred embodiments include a planar quantum well (52) with a gate insulator (56) and gate (58) on one surface and with a tunneling barrier (54) and source (62) and drain (60) on the other surface. The conduction current comprises electrons tunneling from the source (62) into the well (52) and then out into the drain (60). The gate (58) bias shifts the well subband levels up and down to establish and disrupt resonance for the tunneling from the source (62) into the well (52). Other preferred embodiments include interdigitated source and drain, multiple gates, multiple wells, and floating gates.

18 Claims, 28 Drawing Figures

THREE TERMINAL TUNNELING DEVICE

BACKGROUND OF THE INVENTION

1. Field of the Invention

The present invention relates to electronic semiconductor devices, and, more particularly, to quantum well devices in which carrier resonant tunneling is modulated to provide transistor action.

2. Description of the Related Art

Quantum well devices are known in various forms, heterostructure lasers being a good example. Quantum well heterostructure lasers rely on the discrete energy levels in the quantum wells to achieve high efficiency and typically consist of a few coupled quantum wells; see, generally, Sze, Physics of Semiconductor Devices, 729–730 (Wiley Interscience, 2d Ed 1981). High Electron Mobility Transistors (HEMTs) are another type of quantum well device and typically use only one-half of a quantum well (a single heterojunction) but may include a stack of a few quantum wells. The HEMT properties arise from conduction parallel to the heterojunctions and in the quantum well conduction or valence subbands; the conduction carriers (electrons or holes) are isolated from their donors or acceptors and this isolation limits impurity scattering of the carriers. See, for example, T. Drummond et al, Electron Mobility in Single and Multiple Period Modulation-Doped (Al,-Ga)As/GaAs Heterostructures, 53 J. Appl. Phys. 1023 (1982). Superlattices consists of many quantum wells so tightly coupled that the individual wells are not distinguishable, but rather the wells become analogous to atoms in a lattice. Consequently, superlattices behave more like new types of materials than as groups of coupled quantum wells; see, generally, L. Esaki et al, Superfine Structure of Semiconductors Grown by Molecular-Beam Epitaxy, CRC Critical Reviews in Solid State Sciences 195 (April 1976).

Resonant tunneling devices are the simplest quantum well devices that exhibit quantum confinement and coupling and were first investigated by L. Chang et al. 24 Appl. Phys. Lett. 593 (1974), who observed weak structure in the current-voltage characteristics of resonant tunneling diodes at low temperatures. More recently, Sollner et al, 43 Appl. Phys. Lett. 588 (1983), have observed large negative differential resistance in such devices (peak-to-valley ratios as large as six to one have been obtained), and Shewchuk et al, 46 Appl. Phys. Lett. 508 (1985), have demonstrated room temperature resonant tunneling.

Figure 1A:
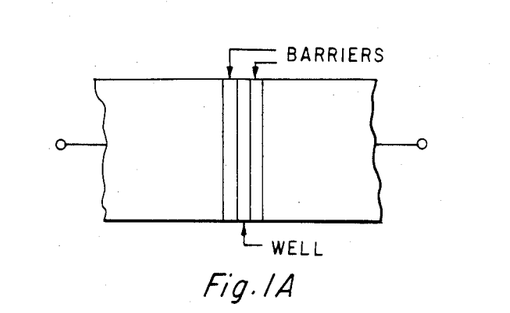
FIGS. 1A-D schematically illustrate a resonant tunneling diode.
Figure 1B:
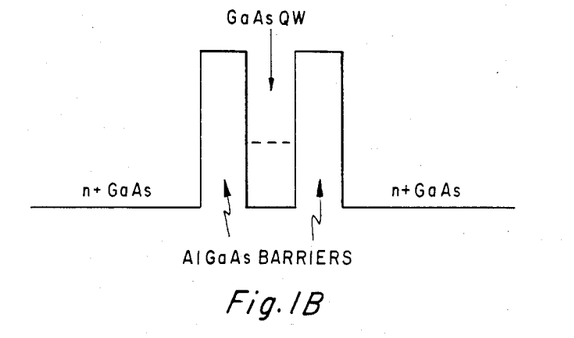
Figure 1C:
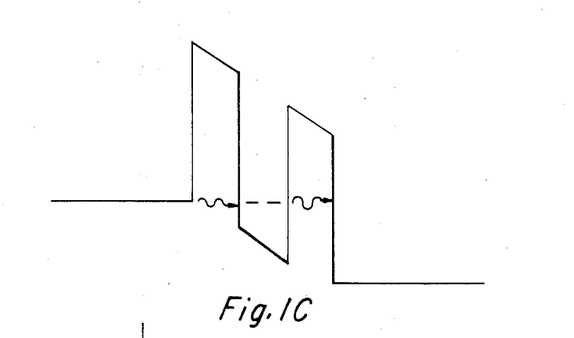
Figure 1D:
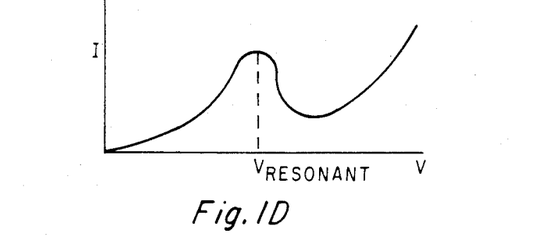

A typical resonant tunneling diode structure is schematically illustrated in FIGS. 1A–D; FIG. 1A is a schematic cross sectional view, FIG. 1B illustrates the profile of the conduction band edge through such a diode with no bias, FIG. 1C is the conduction band edge for bias into resonance, and FIG. 1D is a typical current-voltage characteristic for the diode at low temperature. The preferred material is the lattice matched system of GaAs/Al$_x$Ga$_{1-x}$As, although resonant tunneling has been observed in strained-layer heterostructure systems; see Gavrilovic et al, to appear. The two Al$_x$Ga$_{1-x}$As layers that define the central GaAs quantum well (see FIGS. 1B–C) serve as partially transparent barriers to electron transport through the diode. Resonant tunneling occurs when the bias across the outer terminals is such that one of the quantum well bound states has the same energy level as the input electrode Fermi level. Peaks in the electron transmission (current) as a function of incident electron energy (voltage) are thus observed. The resonant tunneling diode is the electrical analog of a Fabry-Perot resonantor. Leakage (inelastic tunneling current) is determined by the quality of the GaAs/Al$_x$Ga$_{1-x}$As interfaces and electron-phonon scattering.

The resonant tunneling diode has high speed charge transport (less than 100 femtoseconds) which implies applications to microwave oscillators and high speed switches. But the utility of such diodes is limited since they only exist as two terminal devices. The technology to contact the central quantum well (a third terminal) has not been demonstrated and, consequently, only two terminal diodes have been investigated. However, conventional semiconductor integrated circuit technology indicates that three-terminal devices will be necessary to build usable systems composed of quantum well devices. And fundamental problems arise with the obvious approaches to such three-terminal devices as described in the following.

Figure 2A:
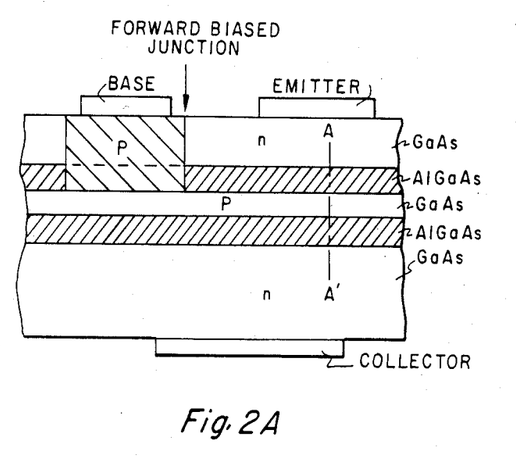
FIGS. 2A-B illustrate a opposite carrier type controlled three-terminal resonant tunneling device.
Figure 2B:
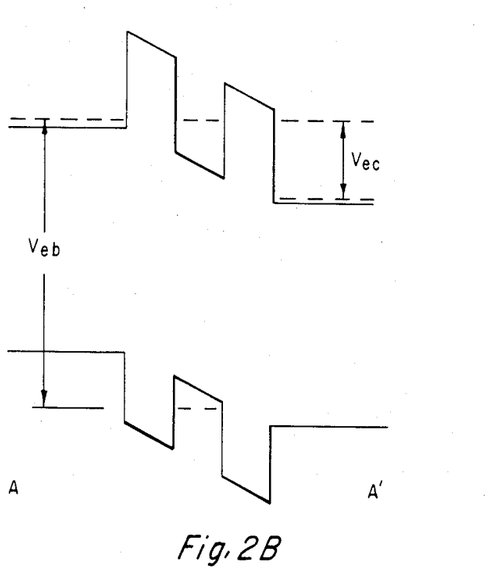

A three-terminal resonant tunneling device requires a way to control the current through the device with a voltage or current supplied to the control terminal. In this discussion the current through the device is presumed to be conducted by resonant tunneling of electrons; a hole conduction current has an analogous discussion. Now the obvious approach is to try to manipulate the potential of the quantum well. If this is to be done through the electrostatic potential, then mobile charges must be added to or removed from the device by the control terminal and these mobile charges will act as sources of the perturbation in the potential. However, the available mobile charges in semiconductors are electrons and holes, and both have problems. First consider what happens when holes are used to control the tunneling current. Because we want to modify the potential in the quantum well, the holes should be placed in the well formed by the valence-band discontinuity; see FIGS. 2A–B illustrating a three-terminal device (with the conduction current terminals labelled "emitter" and "collector" and the control terminal labelled "base" in analogy with bipolar transistors) and the conduction and valence band edges through such a device. To achieve resonant tunneling, the potential of the bottom of the quantum well must be biased below the conduction band edge in the emitter terminal. Note that this implies that the emitter to base bias must be greater than the narrower band gap and in the forward direction for current flow. Now contact with the holes in the quantum well implies a bulk region that is doped p type. If this p region is in contact with the n type emitter, catastrophic current will result. Of course, the p type contact can be of a higher bandgap material, but if the p-n junction occurs at the heterojunction, then the operating bias will still burn out the device because the forward voltage of a p-n heterojunction is determined by the narrower bandgap. If we could put the p-n junction entirely within the wider bandgap material, we still do not have a solution since the junction remains forward biased. Thus the leakage current, while possibly not of catastrophic magnitude, will depend exponentially on the bias voltage, leading to unstable operation. Note that in L. Esaki, European Patent Application No. 82,100,162.5, published Jan. 5, 1983, a base contact to the edge of a 50 Å wide quantum well is illustrated without comment on how to make this contact.

Figure 3A:
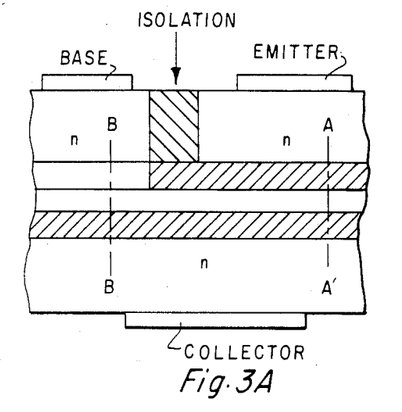
FIGS. 3A-D illustrate a same carrier type controlled three-terminal resonant tunneling device.
Figure 3B:
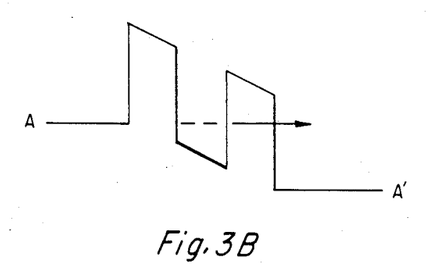
Figure 3C:
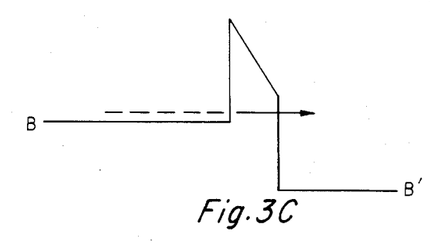
Figure 3D:
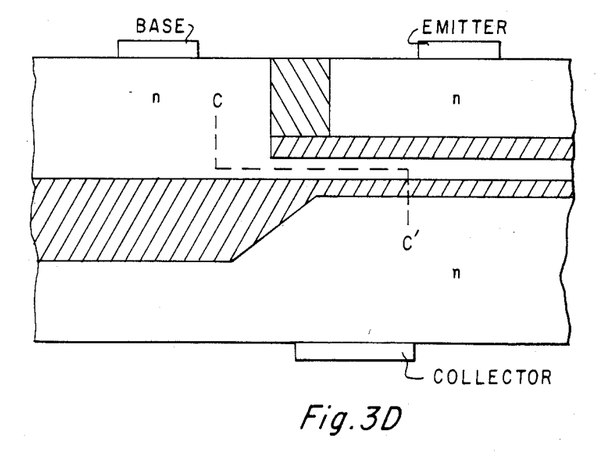

The use of electrons to control the quantum well potential poses a different set of problems, which are closely related to those of the more conventional hot-electron transistors. See J. Shannon and A. Gill, High Current Gain in Monolithic Hot Electron Transistors, 17 Electronics Letters 620 (1981); J. Shannon, Calculated Performance of Monolithic Hot-Electron Transistors, 128 IEEE Proceedings 134 (1981); M. Hollis et al, Importance of Electron Scattering with Coupled Plasmon-Optical Phonon Modes in GaAs Planar-Doped Barrier Transistors, 4 IEEE Electron Device Letters 440 (1983); and, generally, Sze, Physics of Semiconductor Devices 184 (Wiley-Interscience 2 Ed, 1981). To make such a device work we must essentially distinguish between the electrons controlling the current and those carrying the current, but electrons are indistinguishable particles, and thus the device must keep the two groups of electrons separated. As a particular case of this problem, consider the device shown in FIG. 3A, which includes a quantum well that is separately contacted to provide the control terminal, and its conduction band edge along lines A—A and B—B and shown in FIGS. 3B-C. Any electrons supplied to the quantum well from the base contact can readily tunnel out of the well. If we tried to raise or widen the barrier on the collector side to confine these control electrons, we would cut off the desired current of tunneling electrons. Note that the possible solution to this parasitic base-collector current would initially be to buffer the base region from the collector with a high bandgap region as shown in FIG. 3D. Here the same criticism as before applies to current flow along the line C—C, though considerably less in this case due to the relative cross section of emitter-collector to base-collector. The balancing of constraints in such a device makes the possibility of successfully modulating the quantum well potential doubtful.

In short, there is a need for three-terminal quantum well resonant tunneling devices without the problems of maintaining the distinction between controlled and controlling carriers.

SUMMARY OF THE INVENTION

The present invention provides quantum well resonant tunneling devices with a control terminal confinement of the controlling carriers away from the quantum well. The quantum well is accessed by tunneling source and drain contacts on the top side of the well, and a gate on the bottom side of the quantum well establishes the bias on the quantum well, thus controlling tunneling into the quantum well. The device is biased so that electrons tunnel from the source into the well, propagate to the regions under the drain, and tunnel out.

This solves the problems of control carrier confinement of three terminal resonant tunneling devices.

BRIEF DESCRIPTION OF THE DRAWINGS

The figures are all schematic and simplified for clarity; packaging, electrodes, leads, etc. have been omitted.

DESCRIPTION OF THE PREFERRED EMBODIMENTS

Figures 4A, 4B:
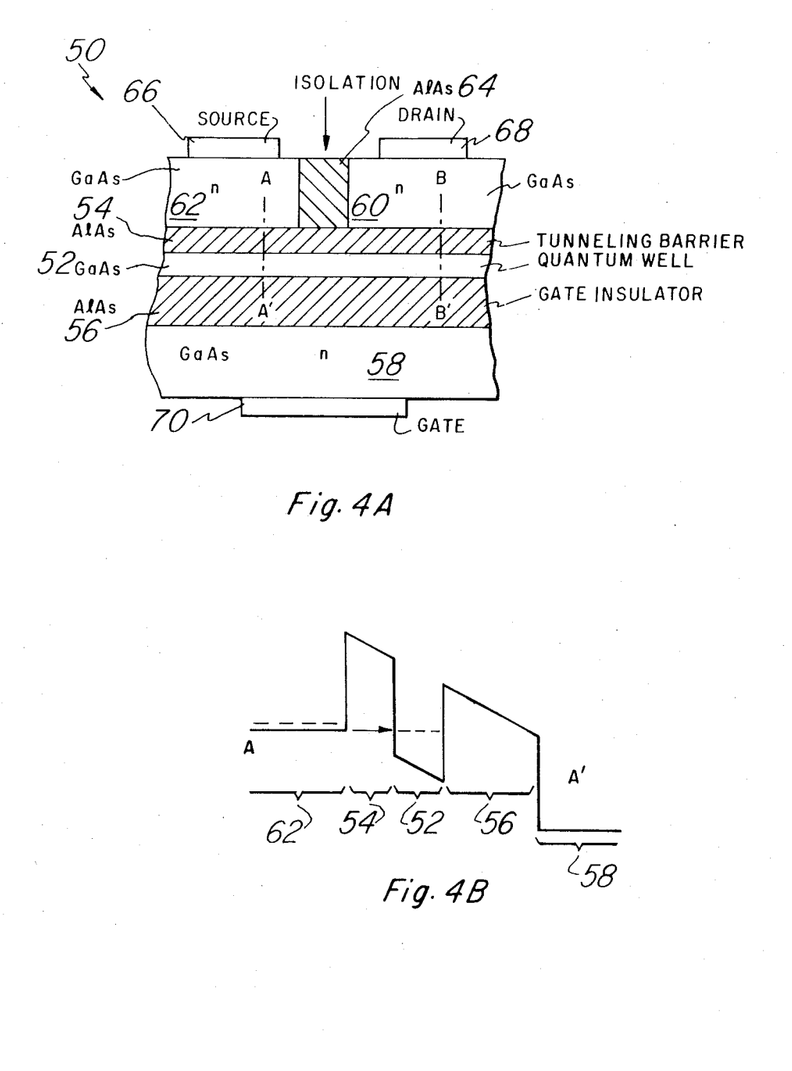
FIGS. 4A-D illustrate a first preferred embodiment three-terminal resonant tunneling device.
Figure 4C:
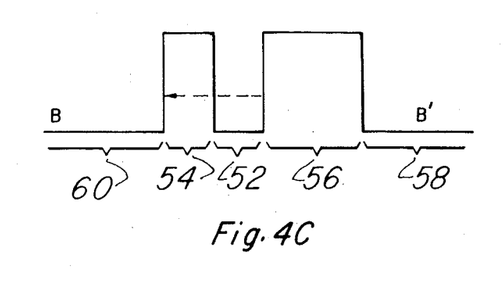
Figure 4D:
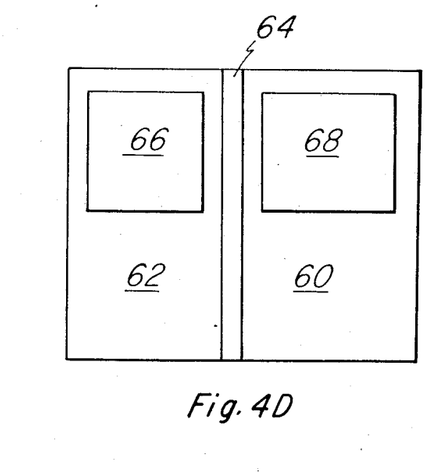

A first preferred embodiment three terminal tunneling device, generally denoted 50, is schematically illustrated in cross sectional elevation view in FIG. 4A with the conduction band edges along lines A—A and B—B shown in FIGS. 4B-C. Device 50 includes layer 52 of undoped GaAs, layers 54 and 56 of undoped AlAs, layer 58 of GaAs doped $n^+$ type, region 60 of GaAs doped $n^+$, region 62 of GaAs doped $n^+$, region 64 of undoped AlAs, and gold/germanium contacts 66, 68, and 70; passivation, packaging, and leads are not shown for clarity. These layers and regions are most conveniently referred to by the names of analogous field effect transistor structures; thus region 62 is called the source, region 60 the drain, layer 58 the gate, layer 52 the well, layer 54 the tunneling barrier, and layer 56 the gate insulator. Layers 52, 54, 56, and 58 all have a common square cross section of about 10 microns by 10 microns but with thicknesses as follows: layer 52 is about 50 Å, layer 54 about 100 Å, layer 56 about 500 Å, and layer 58 plus regions 60, 62, and 64 are all so thick (more than a micron) that no dimensional quantrum effects are apparent. Isolation 64 between source 62 and drain 60 is about 500 Å wide. FIG. 4D is a plan view of device 50 as seen from the source and drain side.

The operation of device 50 is heuristically suggested by FIGS. 4B-C: if source 62 is biased negatively with respect to drain 60 and gate 58, then electrons can tunnel from source 62 through barrier 54 and into a subband (dotted line) in well 52; these same electrons can then tunnel out of the subband through barrier 54 into drain 60 and this tunneling current is the conduction current for device 50. The tunneling from source 62 into well 52 has resonant peaks when the conduction band edge in source 62 is approximately at the same energy level as the bottom of a subband in well 52; thus applied voltages to gate 58 can create or disrupt the resonant tunneling and thereby control the conduction current from source 62 to drain 60. A more detailed description depends on factors such as transition rates of electrons between subbands in well 52 and tunneling rates through barrier 54, and thus some approximate quantitative analysis will be used as an explanation aid. However, the approximations used and the analysis performed should not be construed to be part of device 50.

For specificity, a spatial coordinate system in chosen with x the variable along the direction of lines A—A and B—B in FIGS. 4A and y, z the variables parallel to the interfaces between the layers 52, 54, 56, and 58. We shall use the effective mass approximation for an electron in the conduction band which presumes the electronic wavefunction is the product of the Bloch function at the bottom of the conduction band and an envelope function of the form:

$$\zeta(x)e^{i(yk_y+zk_x+xk^x)}$$

where the wave vectors $k_y$ and $k_z$ are measured relative to the conduction band edge, $k_x$ depends on $k_y$ and $k_z$, and $\zeta(x)$ is a solution of the eigenvalue equation:

$$-\frac{\hbar^2}{2m}\zeta(x)'' - e\phi(x)\zeta(x) = E\zeta(x).$$

The electrostatic potential is $\phi(x)$, and E is the eigenvalue corresponding to $\zeta(x)$. This models the potential energy of the electron ($-e\phi(x)$) as equal the conduction band edge, with the electrostatic field generated by other electrons in the same or other subbands in well 52 in the conduction band accounted for by band bending. The Bloch function in AlAs will be taken to be of the same form as in GaAs.

The first calculation finds the approximate lowest energy eigenvalues for an electron in the potential well formed by layers 52. Well 52 is a potential well in the x direction only, and thus the discrete energy levels (eigenvalues E) calculated for $k_y$ and $k_z$ equal zero will infact be the bottoms of subbands with almost a continuum of levels corresponding to increasing $k_y$ and $k_z$ due the large y and z dimensions. The effective mass approximation at the bottom edge of a subband presumes parabolic subband edges (kinetic energy is a quadratic function of wavevector) so the kinetic energy of an electron with wave vector ($k_x$, $k_y$, $k_z$) is $$\frac{(\hbar k_x)^2}{2m_l} + \frac{(\hbar k_y)^2 + (\hbar k_z)^2}{2m_t}$$

where $m_l$ is the effective mass in the x (longitudinal) direction and $m_t$ the effective mass in the y-z (transverse) directions. For calculations, taking both $m_l$ and $m_t$ equal to 0.067 times the rest mass of an electron amounts to using the bulk GaAs lower valley effective mass.

Now, consider the wavefunction of a single electron in the lowest energy subband in well 52; this corresponds to a solution $\zeta(x)$ with $-e\phi(x)$ the square well 52 and E the smallest such eigenvalue. We can approximate the wavefunction as follows:

$$\Psi_0(x,y,z;k_x,k_y,k_z) = \begin{cases} Au(.)e^{i(yk_y+zk_z)}e^{xk_1} & x \leq 0 \\ Bu(.)e^{i(yk_y+zk_z)}\sin(xk_2 + c) & 0 \leq x \leq 50\text{Å} \\ Cu(.)e^{i(yk_y+zk_z)}e^{-xk_3} & 50\text{Å} \leq x \end{cases}$$

where A, B, C, c, $k_1$, $k_2$, $k_3$ are determined by matching boundary conditions, u(.) is the Bloch function, $k_y$ and $k_z$ are the wave vectors in the y and z directions, and $k_1$, $k_2$, $k_3$ are the x wave vectors in the three layers 54, 52, and 56; note that the origin for the x coordinate has been taken to be at the interface of layers 52 and 54 for convenience, and that $k_1$, $k_2$, $k_3$ will be the lowest of a discrete plus continuous set of possible solutions for each $k_y$,$k_z$ pair. Also note that the potentials from layers 54 and 56 have been approximated by constant potentials of infinite extent; and that the electron spin has been suppressed.

The conduction band discontinuity at the interface of layers 52 and 54 and the interface of layers 52 and 56 is about 0.92 eV (920 meV); this is the generally accepted partition of the direct bandgap difference between GaAs and AlAs into 60% as conduction band discontinuity and 40% valence band discontinuity. Using these values in the previous approximation indicates that the ground state energy level (unexcited level, bottom of the lowest subband edge) for well 52 lies at roughly 100 meV above the conduction band edge (that is, the lowest subband bottom edge is 100 meV above the band edge), with the first excited level lying at 400 meV. (These low levels were calculated by approximating well 52 with an infinitely high barriers.) Above this, the next level lies at roughly 700 meV, with more closely spaced levels extending above, due to the proximity (in energy) of the top of the barriers. See FIGS. 5A-5B, 6A-6B which label the corresponding layers with the reference numerals of FIG. 4A for an indication of the lower energy levels. Of course, these values are only illustrative, and different values would only adjust parameters and not principles of operation.

Further, observe that if the lowest subband in well 52 were filled with electrons to a density of $1 \times 10^{12}/\text{cm}^2$, then the discrete energy levels are essentially shifted up by about 100 meV due to the electrostatic potential created by the electrons, but the relative spacing of the energy levels has only a neglible change. Such an electron density is feasible in view of the fact that the density of states in a GaAs quantum well is approximately $3 \times 10^{13}/\text{cm}^2\text{eV}$.

Figure 5A:
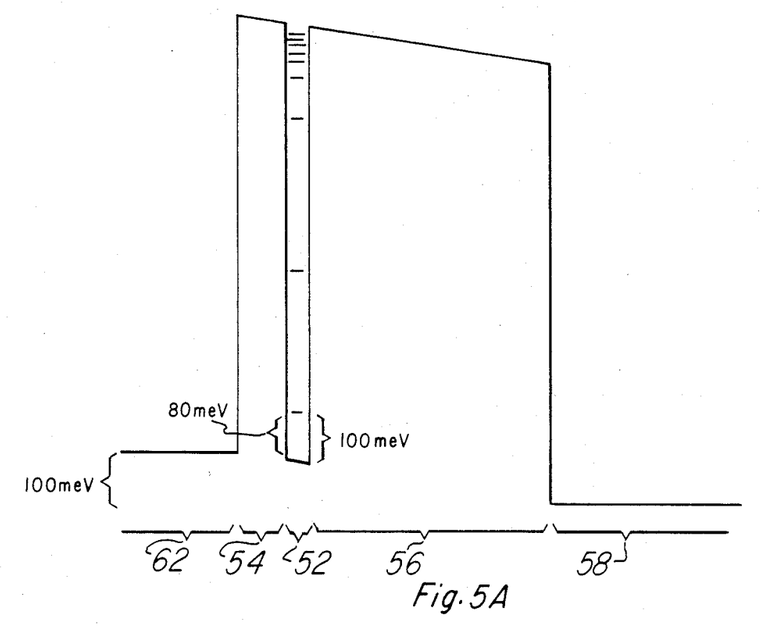
FIGS. 5A-C are conduction band edge diagrams for the first preferred embodiment in the off state.
Figure 5B:
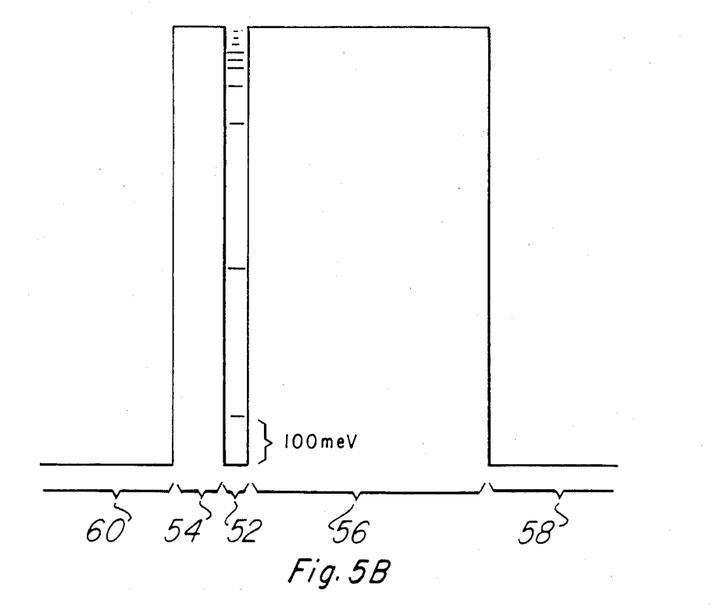
Figure 5C:
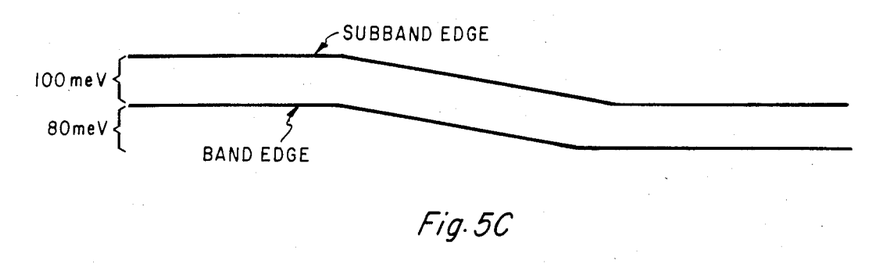

The operation of device 50 can now be described. Initially consider a -100 mV bias of source 62 relative to drain 60 and a 0 bias of drain 60 relative to gate 58. Because source 62, drain 60, and gate 58 are heavily doped, the potential drop appears across the undoped well 52 and barriers 54 and 56, and the conduction band edge along lines A—A' and B—B' of FIG. 4A are as illustrated in FIGS. 5A-B, respectively. The variation of the conduction band edge and lowest subband edge along well 52 parallel to the interfaces with barriers 54 and 56 is illustrated in FIG. 5C; note that the band edge bends in the vicinity of isolation 64 which reflects the bias of source 62 to drain 60. Any electrons in well 52 will tunnel out into source 62 or drain 60, or, for an electron in the bending band portion in the vicinity of isolation 64, a drift in well 52 parallel to the interfaces followed by tunneling out into drain 60, so well 52 is essentially empty. No resonant tunneling from source 62 into well 52 occurs because the subband levels of well 52 are at least about 3 kT (roughly 80 meV at room temperature) above the Fermi and conduction band edge levels of source 62; see FIG. 5A. Observe that an electron in the lowest subband in well 52 and with near minimal energy (subband edge) will be represented by a wave packet formed by superposition of wavefunctions of the type of $\Psi_1$ with a spread of $k_y$ and $k_z$ about zero and $k_2$ roughly equal $\pi/50$ Å (the minimum due to the well 52 thickness constraint). For a spread of $k_y$ and $k_z$ which is small compared to the dimensions of the Brillouin zone, the spatial spread in the y and z directions is several primitive cells of the GaAs lattice. Thus an electron in the lowest subband in well 52 should not be thought of as localized with respect to well 52 but more like a wave travelling in a waveguide formed by well 52 with walls formed by layers 54 and 56.

Figure 6A:
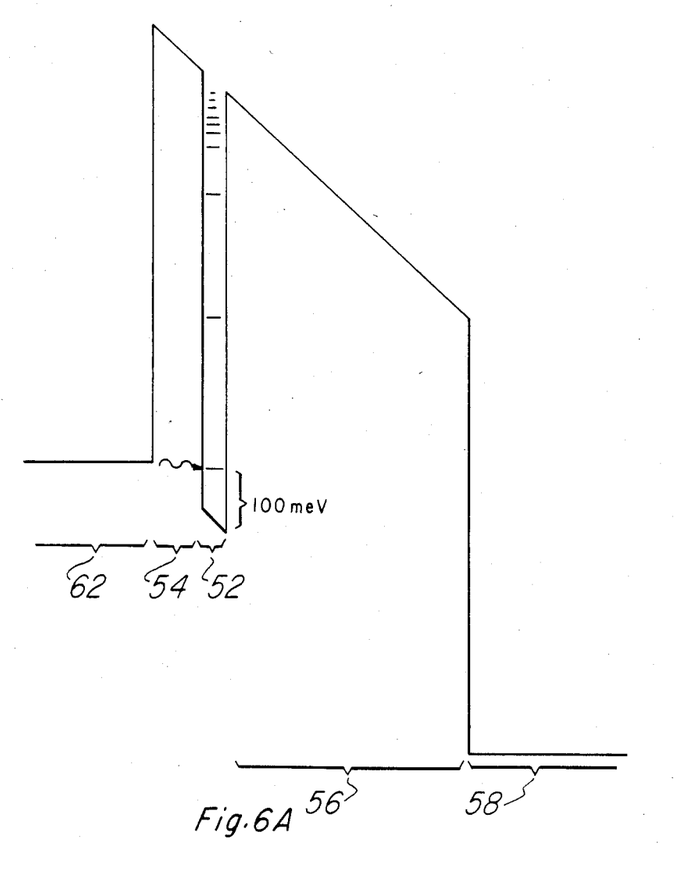
FIGS. 6A-B are conduction band edge diagrams for the first embodiment in the on state.
Figure 6B:
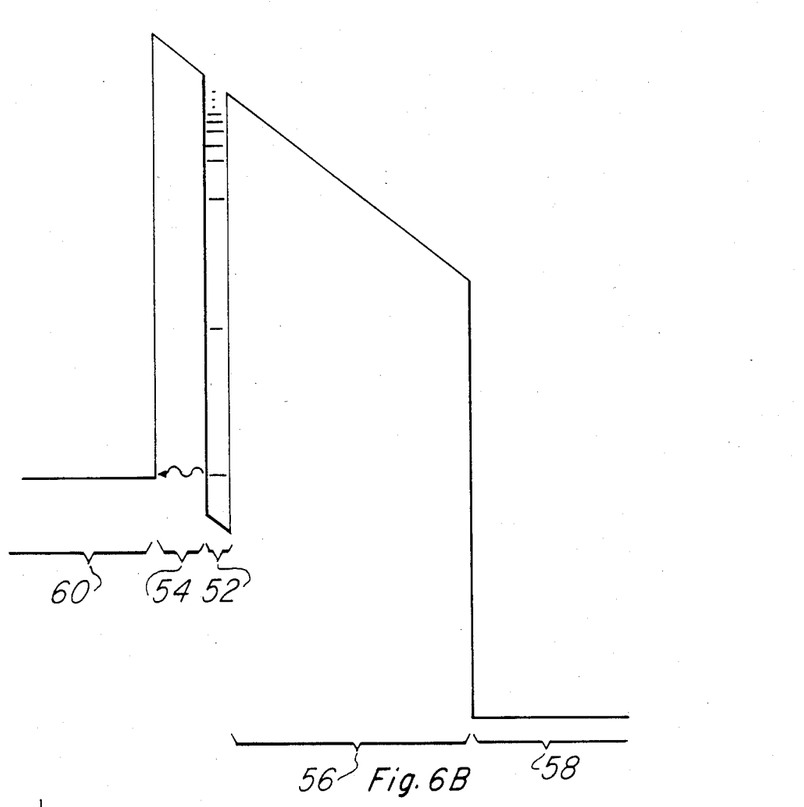

Now consider a bias of source 62 relative to gate 58 of −600 mV with the bias of source 62 relative to drain 60 still at −100 mV. The conduction band edge along lines A—A' and B—B' of FIG. 4A are now as illustrated in FIGS. 6A-B, respectively. This source 62 to gate 58 bias implies an approximate source 62 to well 52 bias of −100 mV and thus a resonance between the Fermi level in source 62 and the lowest subband bottom in well 52. An electron which resonantly tunnels from source 62 into well 52, will move laterally in well 52 analogous to a wave travelling down a waveguide by obliquely reflecting back and forth between the interfaces with barriers 54 and 56, and eventually tunnel out of well 52 back into source 62 or into drain 60; this latter constitutes the conduction current of device 50. When many electrons are tunneling into well 52, they essentially form a two dimensional electron gas in well 52 analogous to that found in a HEMT, and electron-electron scattering greatly complicates the simple picture of a wave travelling down a waveguide. Further, the source 62 to drain 60 bias affects the electron density as a function of position along well 52.

Figure 8:
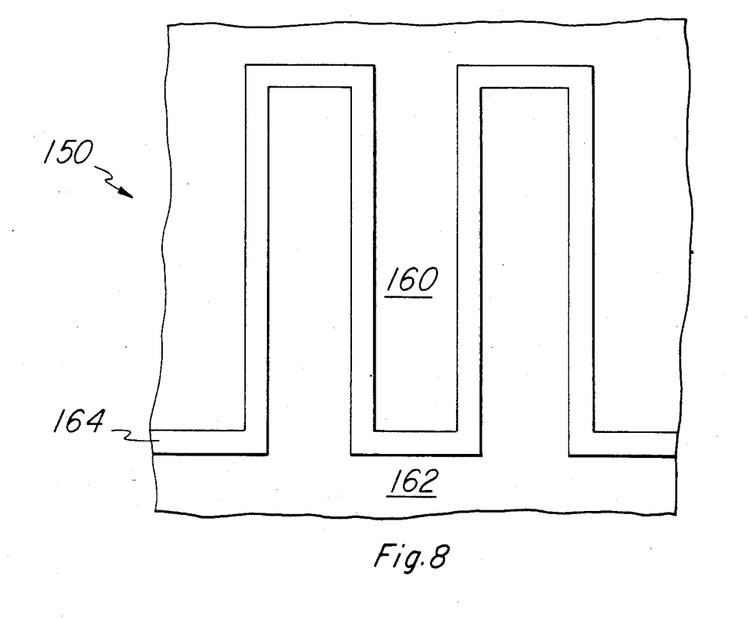
FIG. 8 is a plan view of a second preferred embodiment three-terminal resonant tunneling device.

The probability of an electron tunneling from source 62 into well 52 and then out into drain 60 rather than back into source 62 is greater for electrons that begin closer to isolation 64. Consequently, a second preferred embodiment device generally denoted 150, has interdigitated source and drain and with isolation 164 only 100 Å wide but made of silicon dioxide to provide a higher barrier than the AlAs of isolation 64 (this prevents direct tunneling from source 62 to drain 60). FIG. 8 is a plan view of device 150; the source 162 and drain 160 fingers may be fairly narrow (about 500 Å) to maximize the length of isolation 164; this is analogous to wide gate, short channel microwave MESFETs.

Figure 7:
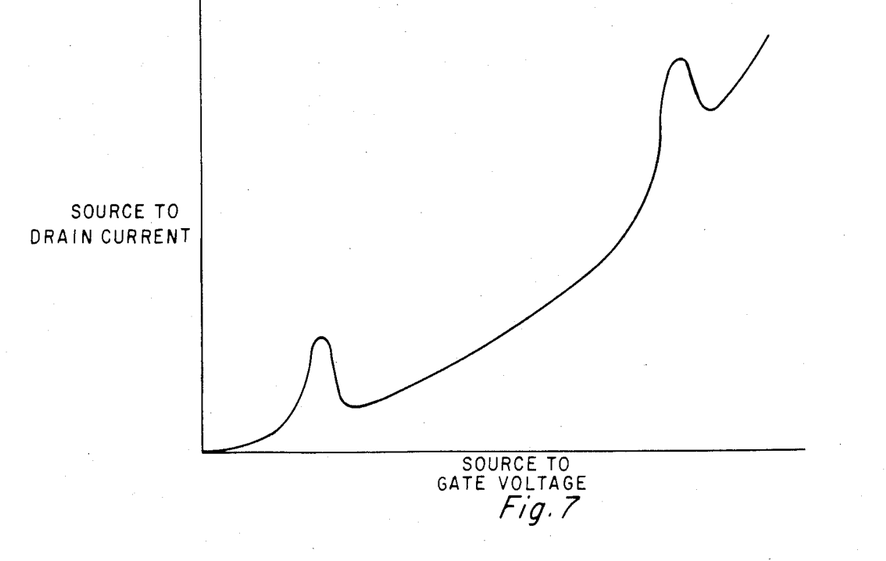
FIG. 7 is a current versus voltage curve for the first preferred embodiment.

Further increase of the source 62 to gate 58 bias first disrupts the resonance of the Fermi level of source 62 with the lowest subband of well 52, but with additional increase a resonance with the first excited subband of well 52 is established. Consequently, the current versus source-to-gate voltage curve varies as illustrated in FIG. 7.

Figure 9A:
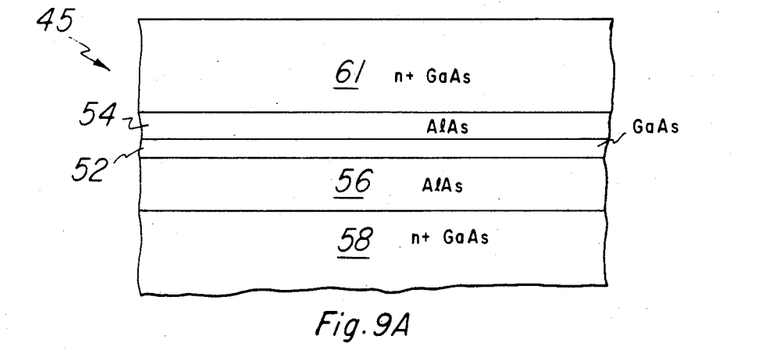
FIGS. 9A-C illustrate the steps of a preferred embodiment method of fabrication of the first preferred embodiment device.

Device 50 may be fabricated by the following steps of the first preferred embodiment method:

(a) Molecular beam epitaxy (MBE) or metalorganic chemical vapor deposition (MOCVD) is used to grow single crystal substrate 45 of $Al_xGa_{1-x}As$ with layers of varying x and varying doping concentrations of silicon per cubic centimeter as shown in FIG. 9A (wherein the layer reference numerals correspond roughly with the resulting elements of device 50) and the following table:

| Layer | Thickness (Å) | x | Doping concentration |
|---|---|---|---|
| 58 | ≧5,000 | 0.0 | $10^{19}$ |
| 56 | 500 | 1.0 | undoped |
| 52 | 50 | 0.0 | undoped |
| 54 | 100 | 1.0 | undoped |
| 61 | 1,000 | 0.0 | $10^{19}$ |

Note that layer 58 could include a thick substrate (such as silicon) for mechanical strength: this substrate would be thinned away after the source, drain, and isolation (including contacts and leads) had been fabricated and passivated to allow mechanical support by affixation of the top surface to a support plug.

Figure 9B:
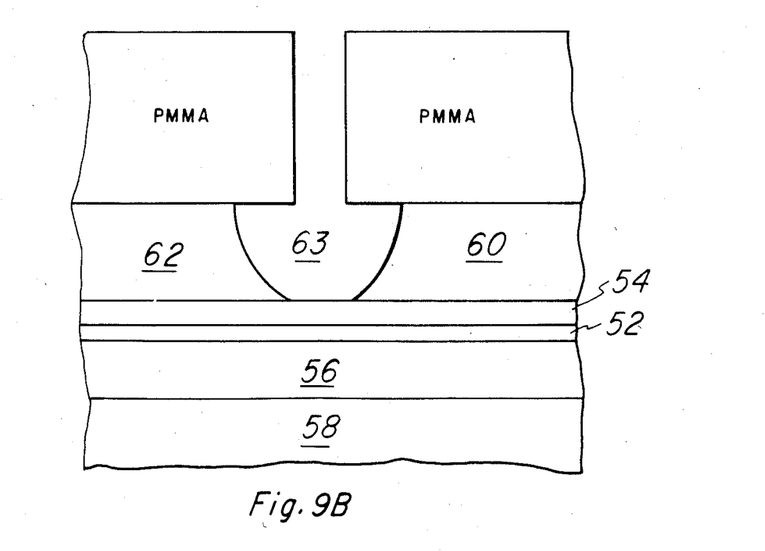

(b) A layer of PMMA (polymethylmethacrylate) about 0.25 micron thick is spun on layer 61 of substrate 45, and a line 500 Å wide is exposed in the PMMA by e-beam or x-ray lithography. The PMMA is developed, and a selective etch such as superoxal is used to etch through GaAs layer 61 (splitting it into source 62 and drain 60) with AlAs layer 54 as the etch stop; see FIG. 9B where reference numeral 63 indicates the region of removed GaAs. An isotropic etch is illustrated in FIG. 9B; anisotropic etches such as plasma $C_2F_6$ could also be used, but stopping at the AlAs is more difficult. Note that an overetch removing a portion of tunneling barrier 54 is not disastrous because AlAs will be grown to fill removed region 63. A combination of an anisotropic etch through the majority of layer 61 followed by the selective isotropic etch will yield less horizontal clearing of the GaAs. However, the curvature of source 62 and drain 60 near isolation 64 is advantageous in that the tunneling current depends primarily on how close source 62 is to drain 60 at the interface with tunneling barrier 54, but the leakage current through isolation 64 depends on how close source 62 is to drain 60 anywhere along isolation 64. Thus minimal leakage current to tunneling current is achieved for the smallest separation between source 62 and drain 60 located at tunneling barrier 54.

Figure 9C:
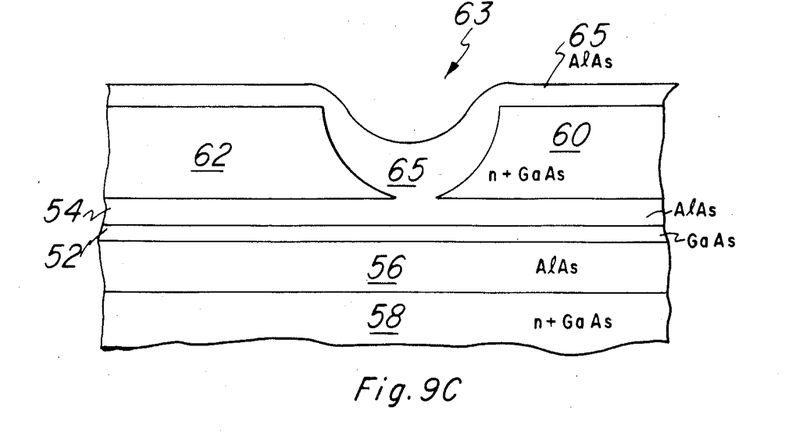

(c) The PMMA is removed, substrate 45 cleaned, and AlAs is grown on the etched surface by MBE or MOCVD. The high temperature of these growth techniques insures that the atoms impinging on the surface have sufficient energy to migrate on the surface to the lowest energy lattice sites; this implies AlAs layer 65 fills removed region 63 much more rapidly than the rest of layer 65 grows on regions 62 and 60; see FIG. 9C which shows the AlAs growth partially complete. A layer 65 thickness of about 2,000 Å is sufficient to have a sufficiently planar surface.

(d) Layer 65 is uniformly etched down into GaAs regions 62 and 60. Lastly, gold:germanium contacts 66, 68, and 70 are deposited by evaporation and liftoff and alloyed to complete device 50.

Figure 10A:
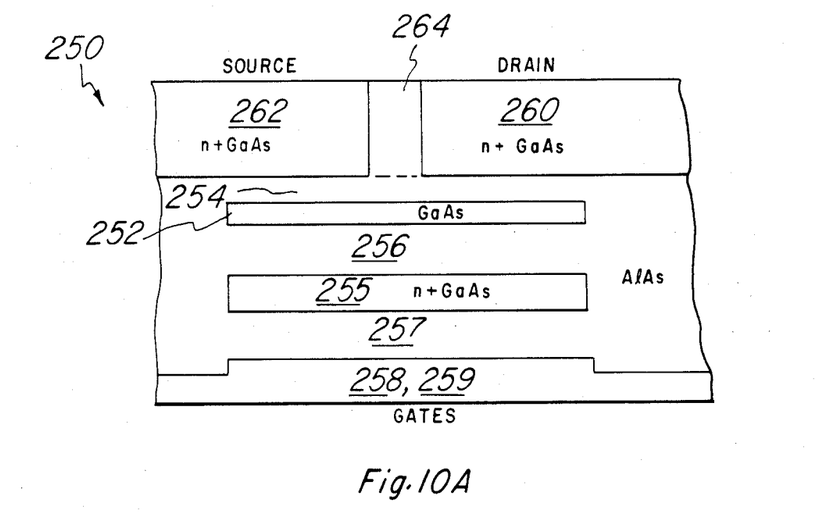
FIGS. 10A-B are cross sectional and plan views of a third preferred embodiment resonant tunneling device.
Figure 10B:
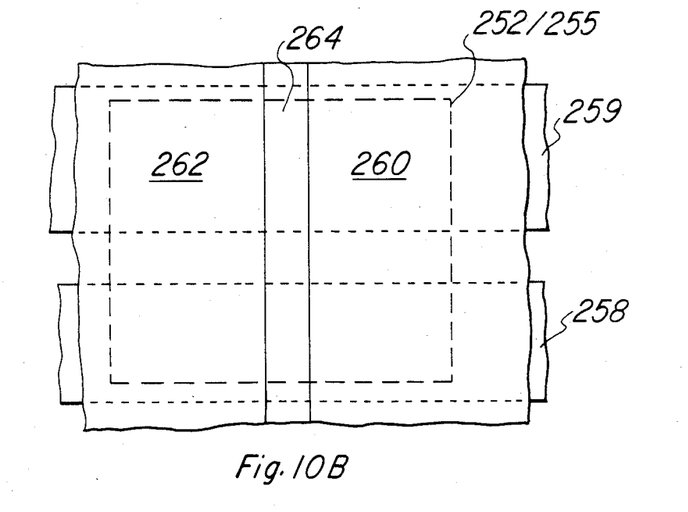

Third preferred embodiment three terminal tunneling device, generally denoted 250, is illustrated FIGS. 10A-B; FIG. 10A is a schematic cross sectional elevation view, and FIG. 10B is a top plan view. Device 250 includes source region 262 of n+ doped GaAs, drain region 260 of n+ GaAs, undoped AlAs isolation region 264, undoped AlAs tunneling barrier 254, undoped GaAs quantum well 252, undoped AlAs gate insulator 256, n+ doped GaAs floating gate 255, undoped AlAs secondary gate insulator 257, and gates 258 and 259. Contacts, leads, packaging, passivation, and so forth have been omitted for clarity. Quantum well 252 and floating gate 255 are about two microns square with gates 258 and 259 about one micron wide and separated by 0.1 micron; isolation 264 is about 400 Å thick (the thickness of isolation 264 and the separation between gates 258 and 259 have been exaggerated for clarity). The layer thickness are as follows: tunneling barrier about 50 Å, well 252 about 50 Å, insulator 256 about 300 Å, floating gate 255 about 300 Å, insulator 257 about 300 Å, and gates 258 and 259 and source 262 and drain 260 all a micron or more.

The operation of device 250 is analogous to that of device 50 with electrons tunneling from source 262 into a subband of well 252, propagating along well 252, and tunneling from well 252 into drain 260 providing the conduction current. In effect, device 50 is a capacitor with one plate being gate 58 and the other plate being split between source 62 and drain 60; well 52 is in the electric field between the plates, and thus voltage applied across the capacitor varies the subband energy levels to establish and disrupt resonance. In contrast, device 250 is two capacitors series connected: the first capacitor with one plate being floating gate 255 and the other plate split between source 262 and drain 260, and the second capacitor with one plate also being floating gate 255 and the other plate split between gates 258 and 259. Thus the induced separated charge on floating plate 255 depends on the average of the voltages on gates 258 and 259, and this average then basically determines the electric field between the plates of the first capacitor and, consequently, the well 252 subband energy level variation.

As an example of a logic circuit application of device 250, presume that the lowest subband of well 252 has an energy level that is in resonance with the conduction band edge of source 262 when the average voltage on gates 258 and 259 is one-half the voltage of a logic "1" (a logic "0" is zero voltage) and presume that the second lowest subband of well 252 has an energy level that is still too high for resonance with the conduction band edge of dource 262 when both gates 258 and 259 are at a logic "1" voltage. In this situation the resonant tunneling current flows from source 262 to drain 260 only if one but not both of gates 258 and 259 is at a logic "1" voltage; that is, device 250 operates as an exclusive OR device. All other digital Boolean functions can be constructed using this device as the basic switching element. Moreover, the action of multiple gate electrodes is approximately proportional to their relative areas and bias potentials, so device 250 is capable of providing analog control of tunneling current from source 262 to drain 260.

Figure 11A:
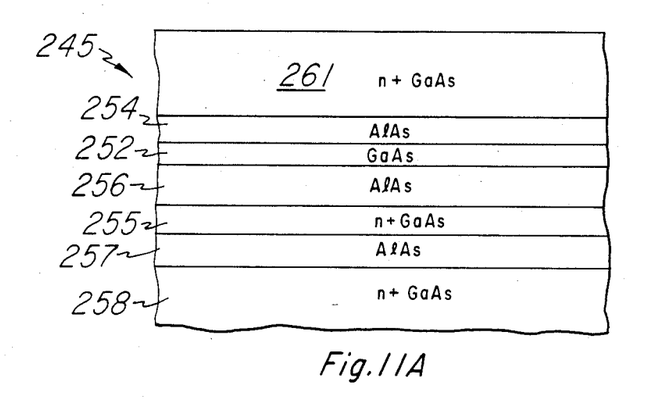
FIGS. 11A-B illustrate steps of another preferred embodiment method of fabrication of the third preferred embodiment device.

Device 250 may be fabricated by the following steps of the third preferred embodiment method:

(a) Molecular beam epitaxy (MBE) or metalorganic chemical vapor deposition (MOCVD) is used to grow single crystal substrate 245 of $Al_xGa_{1-x}As$ with layers of varying x and varying doping concentrations of silicon per cubic centimeter as shown in FIG. 11A (wherein the layer reference numerals roughly correspond with the resulting elements of device 250) and the following table:

| Layer | Thickness (Å) | $\chi$ | Doping concentration |
|---|---|---|---|
| 258 | $\geq$ 10,000 | 0.0 | $10^{19}$ |
| 257 | 300 | 1.0 | undoped |
| 255 | 300 | 0.0 | $10^{19}$ |
| 256 | 300 | 1.0 | undoped |
| 252 | 50 | 0.0 | undoped |
| 254 | 50 | 1.0 | undoped |
| 261 | 10,000 | 0.0 | $10^{19}$ |

Note that layer 258 could include a thick substrate (such as silicon) for mechanical strength; this substrate would be thinned away after the source, drain, and isolation (including contacts and leads) had been fabricated and passivated to allow mechanical support by affixation of the top surface to a support plug.

(b) A layer of PMMA (polymethylmethacrylate) about 0.25 micron thick is spun on layer 261 of substrate 245, and a line 400 Å wide is exposed in the PMMA by e-beam or x-ray lithography. The PMMA is developed, and a selective etch such as superoxal is used, either alone or in conjunction with an anisotropic plasma etch, to etch through GaAs layer 261 (splitting it into source 262 and drain 260) with AlAs layer 254 as the etch stop; see the explanation in connection with device 50.

(c) The PMMA is removed, substrate 245 cleaned, and AlAs is grown on the etched surface by MBE or MOCVD. The high temperature of these growth techniques insures that the atoms impinging on the surface have sufficient energy to migrate on the surface to the lowest energy lattice sites; this implies AlAs layer 265 fills the etched away region of layer 261 much more rapidly than the rest of layer 265 grows on regions 262 and 260; see the explanation in connection with device 50.

(d) Layer 265 is uniformly etched down into GaAs regions 262 and 260. Gold:germanium contacts (not illustrated) are deposited by evaporation and liftoff and alloyed to complete contacts to source 262 and drain 260, and the surface is passivated with silicon nitride 270 deposition.

Figure 11B:
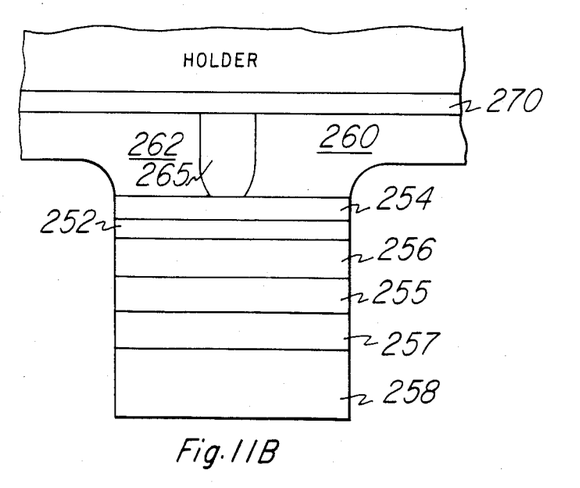

(e) The passivated surface of substrate 245 is affixed to a holder, and layer 258 thinned down to about two microns thickness. Then photoresist is spun on layer 258 and is patterned for the two micron square well 252 and floating gate 258. Anisotropic etching (such as RIE) of substrate 245 using the patterned photoresist mask down to source 262 and drain 260 yields the structure shown in FIG. 11B.

(f) AlAs is grown on the etched surface of substrate 245; as noted in connection with device 50, the growth is faster in the etched-out regions and tends to planarize. If necessary, a planarization by spin on photoresist that can be etched at approximately the same rate as AlAs may be used; in any event, the grown AlAs is etched down into GaAs layer 258. Then a new layer 258' of n+ doped GaAs is grown to a thickness of about one micron, photoresist is spun on layer 258' and patterned to define gates 258 and 259, and layer 258' is selectively etched. Contacts, leads, passivation, and packaging complete device 250.

MODIFICATIONS AND ADVANTAGES

The dimensions and materials of the preferred embodiment devices can be greatly varied while still preserving the mode of operation. For example, the GaAs and AlAs could be replaced by $Al_xGa_{1-x}As$ for different xs. Indeed, the aluminum gallium arsenide system could be replaced with other systems such as indium arsenide phosphide, mercury cadmium telluride, strained layers of lattice mismatched systems, etc. and still maintain single crystal structures; but further, the devices could fabricated from thin layers of glasses, insulators, metals, etc. and still provide the quantum well structure and operation as in the preferred embodiments.

Holes instead of electrons could be the carrier, or even both holes and electrons transported in opposite directions simultaneously. The dopants and doping levels could be widely varied. The energy levels could be changed by either dimensional changes or material changes or combinations. For example, the wells could have triangular composition profiles, and strained layers could be used.

The temperature of operation may be adjusted, and this has the effect of expanding or contracting the phonon population and thus the scattering of the carriers in the well.

Various geometries are available, such as interdigitated source and drain, interdigitated gates, multiple sources and drains (so one set of gates controls a plurality of parallel source-drains), various source and drain coaxial areas to adjust tunneling current density, multiple quantum wells (laterally separated and of different subband energies so multiple peaks in the current versus voltage curve may be obtained), multiple gates with the floating gate (device 250 was illustrated with only two gates 258 and 259 for simplicity of explanation: multiple gates with different sizes leads to different weighting of the effect of voltages on the different gates).

Also, strained layer superlattices, modulation-doped superlattices and tunable superlattices could be used and provide further controllable parameters in the operation; for example, a tunable modulationdoped superlattice with graded doping to produce an approximate saw tooth conduction and/or valence band edge.

The equilibrium charge density in the controlled well is a function of the tunneling cross section between the controlled well and the source and drain, so variation of the relative areas of the source and drain can be used to adjust device performance. For example, if the drain is much larger than the source, relatively less charge will exist in the controlled well in resonant equilibrium. If the source is relatively larger than the drain, relatively more charge will exist in the controlled well in resonant equilibrium.

The device can be operated in either the enhancement mode (as are the preferred embodiments) or in the depletion mode (with no bias on the base resonant tunneling from the emitter into the well occurs, and with gate bias applied the resonance is disrupted) by adjusting the dimensions and materials.

The advantages of the preferred embodiments and modifications include the extremely small devices with high transfer speeds and high density available with relatively simple structure and fabrication.

What is claimed is:

1. A semiconductor three terminal tunneling device, comprising:
   (a) a planar quantum well;
   (b) a planar tunneling barrier abutting said well on a first planar surface of said well;
   (c) adjacent planar source and drain regions abutting said barrier on the planar surface of said barrier opposite said well, said source and drain separated by an isolation region;
   (d) an insulation layer abutting the second planar surface of said well; and
   (e) a gate abutting said insulation layer opposite said well; whereby bias applied between said source and gate determines resonant tunneling of carriers from said source into said well, and bias applied between said source and drain determines tunneling of said carriers out of said well into said drain.

2. The device of claim 1, wherein:
   (a) said source and drain regions are interdigitated.

3. The device of claim 1, wherein:
   (a) said well and said source and drain regions are made of essentially the same semiconductor material.

4. The device of claim 3, wherein:
   (a) said well and said source and drain regions are made of GaAs; and
   (b) said tunneling barrier is made of AlAs, with said source region, drain region, tunneling barrier, and well forming a single crystal.

5. The device of claim 4, wherein:
   (a) said insulation layers includes a planar floating gate parallel to and spaced away from said second planar surface of said well and spaced away from said gate.

6. The device of claim 5, wherein:
   (a) said insulation layer is made of AlAs;
   (b) said floating gate is made of GaAs;
   (c) said gate is made of GaAs, with said source region, drain region, tunneling barrier, well, insulation, floating gate, and gate forming a single crystal.

7. The device of claim 1, further comprising:
   (a) a second gate abutting said insulation layer opposite said well and isolated from said gate.

8. The device of claim 7, further comprising:
   (a) a floating gate located in said insulation layer and between said well and said gate and second gate.

9. The device of claim 8, wherein:
   (a) said source region, drain region, well, gate, floating gate, and second gate are made of GaAs; and
   (b) said tunneling barrier and insulation are AlAs, with said source region, drain region, well, gate, floating gate, second gate, tunneling barrier, and insulation forming a single crystal.

10. A semiconductor logic device, comprising:
    (a) a planar quantum well abutting a planar tunneling barrier and an insulation layer;
    (b) source and drain regions abutting said barrier opposite said well, and a bias applied from said source to said drain; and
    (c) a plurality of input gates abutting said insulation layer opposite said well, wherein input logic signals applied to said input gates together establish or disrupt the resonance of the source conduction band edge with the well subband edges and thereby switch the source to drain current.

11. The device of claim 10, further comprising:
    (a) a floating gate located in said insulation layer and between said well and said input gates.

12. The device of claim 11, wherein:
    (a) said source region, drain region, well, input gates, and floating gate are made of GaAs; and
    (b) said tunneling barrier and insulation are AlAs, with said source region, drain region, well, input gates, floating gate, tunneling barrier, and insulation forming a single crystal.

13. A semiconductor tunneling device, comprising:
    (a) a stack of five planar layers of semiconductor materials forming a single crystal with said layers alternating wide bandgap and narrow bandgap semiconductor materials;
    (b) the top layer of said stack is narrow bandgap and partitioned into doped-conductive source and drain regions separated by isolation material;
    (c) the second-from-the-top layer is wide bandgap and of carrier tunneling thickness;
    (d) the third-from-the-top layer is narrow bandgap and of quantum well thickness;
    (e) the fourth-from-the-top layer is wide bandgap and of gate insulation thickness; and
    (f) the bottom layer is narrow bandgap and doped-conductive to form a gate.

14. The device of claim 13, wherein:
    (a) said source and drain regions are interdigitated.

15. The device of claim 13, further comprising:
    (a) a floating gate in said fourth-from-the-top layer, said gate spaced from said third-from-the-top and bottom layers.

16. The device of claim 13, wherein:

(a) said bottom layer is partitioned to form a plurality of gates isolated from each other.

17. The device of claim 16, further comprising:
(a) a floating gate in said fourth-from-the-top layer, said gate spaced from said third-from-the-top and bottom layers.

18. The device of claim 13, wherein:
(a) said narrow bandgap material is GaAs; and
(b) said wide bandgap material is AlAs.

* * * * *